United States Patent
Arambepola et al.

(10) Patent No.: US 8,392,802 B2
(45) Date of Patent: Mar. 5, 2013

(54) SPECTRAL CONTENT BASED DECODING AND FREQUENCY OFFSET ESTIMATION

(75) Inventors: Bernard Arambepola, Enfield (GB); Vinesh Bhunjun, Potter Bar (GB); Thushara Hewavithana, Borehamwood (GB); Parveen K. Shukla, Nottingham (GB); Sahan Gamage, Cambridge (GB)

(73) Assignee: Intel Corporation, Sant Clara, CA (US)

( * ) Notice: Subject to any disclaimer, the term of this patent is extended or adjusted under 35 U.S.C. 154(b) by 516 days.

(21) Appl. No.: 12/646,680

(22) Filed: Dec. 23, 2009

(65) Prior Publication Data

US 2011/0154148 A1 Jun. 23, 2011

(51) Int. Cl.
*G06F 11/00* (2006.01)

(52) U.S. Cl. ........................................ 714/776; 714/759

(58) Field of Classification Search .................. 714/776, 714/759, 748, 752, 755, 758
See application file for complete search history.

(56) References Cited

U.S. PATENT DOCUMENTS 5,596,601 A * 1/1997 Bar-David .................... 375/143
5,623,511 A * 4/1997 Bar-David et al. ............ 375/143

\* cited by examiner

*Primary Examiner* — Dieu-Minh Le
(74) *Attorney, Agent, or Firm* — Garrett IP, LLC

(57) ABSTRACT

Methods and systems to identify a codeword associated with samples of a signal from spectral content of the samples, and to estimate a frequency offset from the spectral contents. The samples may correspond to a physical layer header of a data frame. Modulation may be removed from the samples in accordance with each of a plurality of modulation sequences, each sequence associated with a corresponding codeword. Power levels in spectral contents of the modulation-removed samples are examined to identify a peak power level indicative of a match between a modulation sequence and the samples. The corresponding codeword is identified as being associated with the header, and transmission parameters associated with the identified codeword are used to decode a corresponding frame. An estimated frequency offset may be determined from a frequency associated with the peak power level.

20 Claims, 7 Drawing Sheets

SPECTRAL CONTENT BASED DECODING AND FREQUENCY OFFSET ESTIMATION

BACKGROUND

A data transmission may include a physical layer header encoded with transmission parameters to decode a corresponding data frame. The encoding may include forward error correction (FEC) encoding.

At a receiver, the physical layer header may be decoded to identify transmission parameters of the corresponding data frame. The data frame may then be processed in accordance with the transmission parameters. The transmission parameters may include a modulation sequence and/or an encoding rate, and the processing of the data frame may include decoding, such as with a low-density parity check code (LDPC) decoder.

Environmental conditions may reduce an ability of a receiver to decode a physical layer header. For example, environmental conditions may reduce a signal-to-noise ratio (SNR), in some situations to where signal power is lower than noise power. Receiver equipment may also cause a relatively large frequency offset in a received signal. A satellite based transmissions of a digital video broadcast signal, for example, may be received with a SNR of approximately −2.5 dB, signal power being lower than the noise power, and with a frequency offset of approximately 5 MHz.

BRIEF DESCRIPTION OF THE DRAWINGS/FIGURES

FIG. 3 is a graphic illustration of example modulation sequences.

Figure 1:
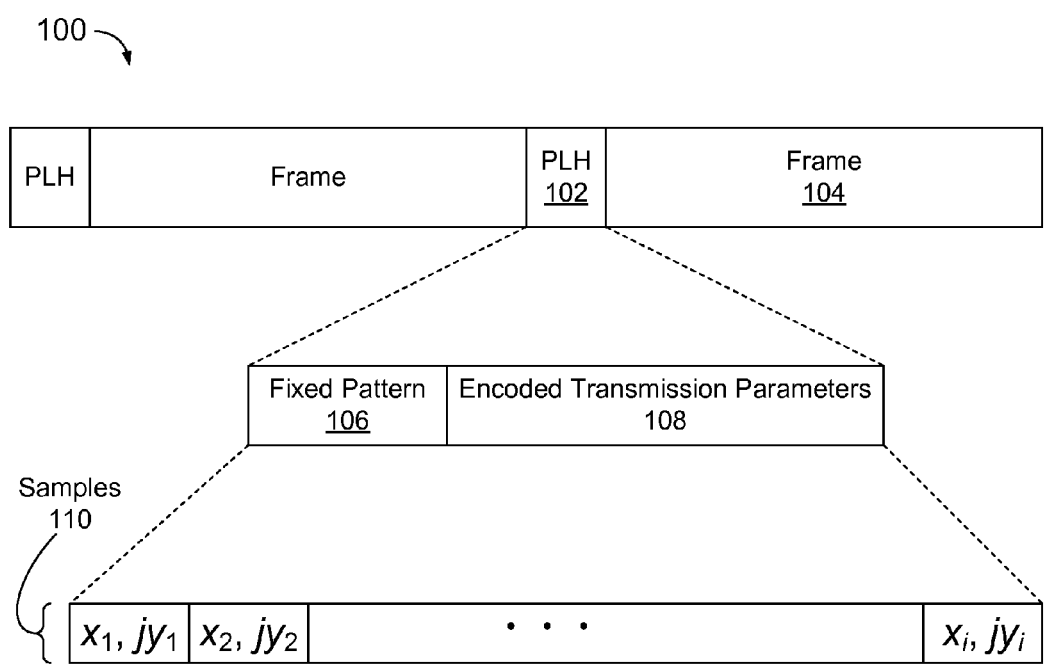
FIG. 1 is a graphic depiction of samples of a signal, including a physical layer header (PLH) and a corresponding body or data frame.

In the drawings, the leftmost digit(s) of a reference number identifies the drawing in which the reference number first appears.

DETAILED DESCRIPTION

Disclosed herein are methods and systems to identify a codeword associated with samples of a signal from spectral contents of the samples. Also disclosed herein are methods and systems to estimate a frequency offset associated with the samples from the spectral content of the samples. The samples may correspond to samples of a header associated with a data frame. The header may correspond to a physical layer header (PLH).

FIG. 1 is a graphic depiction of a signal 100, including a physical layer header (PLH) 102 portion and a corresponding body or data frame portion 104.

Multiple data frames 104 may each be transmitted with different modulation schemes, and data within different data frames 104 may be encoded with different encoding rates.

Multiple PLHs 102 may each be transmitted with a common modulation scheme and may each include information to define transmission parameters associated with corresponding data frames 104. Transmission parameters may include one or more of a modulation scheme and an encoding rate.

Transmission parameters within PLH 102 may be encoded with forward error correction (FEC). Encoding of PLH 102 may correspond to one of a plurality of codewords, each of which may be associated with a corresponding set of transmission parameters. Upon decoding of PLH 102, the corresponding transmission parameters may be used to decode data within data frame 104, such as with a low-density parity check code (LDPC) decoder.

Signal 100 may correspond to, for example and without limitation, a satellite transmission in accordance with a digital video broadcast (DVB) standard.

PLH 102 may include a fixed pattern portion 106, and a second portion 108 to include encoded transmission parameters. Fixed pattern portion 106 may include, for example, a 26-symbol fixed pattern. Second portion 108 may include, for example, a 64-symbol segment. Second portion 108 may be encoded with, for example, a Reed-Muller encoding scheme.

PLH 102 may be modulated in accordance with, for example, π/2-BPSK (binary phase shift keying), which corresponds to BPSK with odd symbols rotated by π/2, to appear similar to QPSK (quadrature phase shift keying).

Data frame 104 may be modulated in accordance with, for example, one of QPSK (quadrature PSK), 8PSK (8-phase shift keying), 16APSK (16-ary amplitude and phase-shift keying, or asymmetric phase-shift keying), and 32APSK.

PLH 102 may include a codeword from a set of, for example, 28 codewords.

Figure 2:
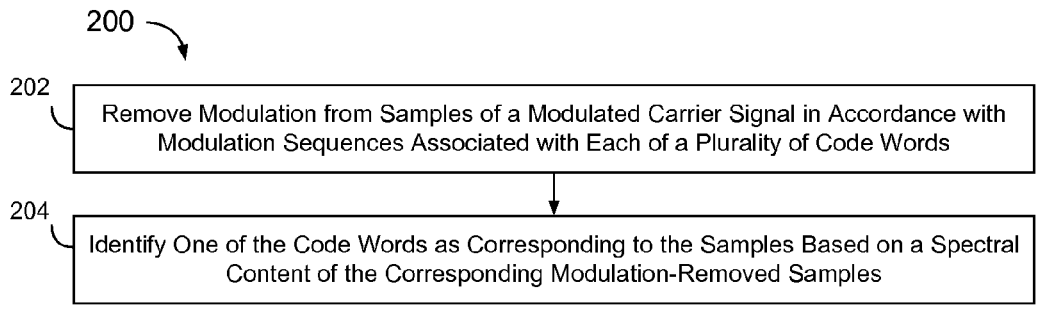
FIG. 2 is a process flowchart of a method of removing modulation from samples in accordance with modulation schemes associated with each of a plurality of codewords, and of identifying one of the codewords as corresponding to the samples based on spectral contents of the modulation-removed samples.

FIG. 2 is a process flowchart of a method 200 of identifying a codeword associated with samples of a signal, based on spectral contents of the samples. The samples may correspond to samples of PLH 102 in FIG. 1. Method 200 is not, however, limited to PLH 102.

At 202, modulation is removed from samples of a modulated carrier signal in accordance with modulation sequences associated with each of a plurality of codewords.

Each codeword within the set of codewords may be associated with a corresponding modulation sequence, and the removing of the modulation may include iteratively applying modulation sequences associated with each of the codewords to the samples.

The samples may be in the form of $(x_i, jy_i)$, where i represents a positive integer number of the samples.

In FIG. 1, samples 110 may be obtained from PLH 102. PLH may include, for example, 90 symbols, and samples 110 may include 90 samples.

FIG. 3 is a graphic illustration of example modulation sequences 302-1 through 302-k, each corresponding to one of k codewords. Each modulation sequence 302 may include a set of binary coordinates, $(r_1, s_1)$ through $(r_i, s_i)$, and the removing of the modulation may be performed in accordance with:

$$u_i + jv_i = (x_i + jy_i)(r_i - js_i), \quad \text{(Eq. 1)}$$

In equation 1, $(u_i+jv_i)$ represents samples, such as samples 110 of PLH 102 in FIG. 1, subsequent to removal of modulation, also referred to herein as modulation-removed samples.

At 204, one of the codewords is identified as corresponding to the samples based on spectral content of the corresponding modulation-removed samples.

When a modulation sequence corresponds to the samples, the removal of the modulation in accordance with modulation sequence associated with the codeword provides a complex exponential at a frequency offset of the samples. This may be expressed as:

$$u_i + jv_i = \exp\left(j\frac{2\pi F i}{R_s} + j\phi\right) + n_i \quad \text{(Eq. 2)}$$

In equation 2:
F corresponds to the frequency offset;
$R_S$ corresponds to the symbol rate; and
$n_i$ corresponds to potential noise in the samples.

When a modulation sequence does not correspond to the samples, the removal of the modulation does not provide a complex exponential.

The spectral content of a set of modulation-removed samples may be determined in accordance with a Fast Fourier Transform. Where the number of samples is less than the number FFT points, the modulation-removed samples may be zero-padded to a length of the FFT. For a 128-point FFT, for example, 90 samples may be zero-padded to a length of 128.

When the modulation sequence corresponds to the samples, the FFT may provide a relatively strong spectral peak at a frequency bin closest to the frequency offset. When the modulation sequence does not correspond to the samples, the FFT does not provide a relatively strong spectral peak.

A codeword may be identified as corresponding to the samples when the spectral content of the corresponding modulation-removed samples has a power level that is larger than power levels of spectral contents of modulation-removed samples associated with other codewords.

The power level may be determined with respect to a largest spectral peak. Where the spectral content is determined with a FFT, power levels associated with frequency bins of the FFT may be compared to a threshold.

The power level may be determined with respect to a ratio of a largest spectral peak and another spectral peak, such as a second largest spectral peak that is not adjacent to the largest peak.

The identifying of a codeword at 204 may include detecting spectral inversion at a receiver input from spectral contents of modulation-removed samples. Where there is spectral inversion, the modulation-removed samples may not provide a spectral peak with respect to any of the modulation sequences above. To detect spectral inversion, modulation removal at 204 may be performed with respect to complex conjugates of the modulation sequences. For example, modulation removal at 204 may be performed with respect to complex conjugate forms of the modulation sequences. When a complex-conjugated modulation sequence provides a relatively large spectral peak, a determination may be made that the input is spectrally inverted. Spectral contents may be examined for spectral inversion when a spectral peak is not identified in samples having modulation removed in accordance with the non-conjugated forms of the modulation sequences.

In some situations, noise, represented as $n_i$ in equation 2, may have power greater than the power of a signal, represented as the complex exponential in equation 2. In a FFT, samples of the complex exponential accumulate coherently, while samples of the noise accumulate non-coherently. Samples of the complex exponential thus reinforce one another, while samples of noise do not reinforce one another. The FFT thus essentially provides a gain with respect to the complex exponential and suppresses or reduces noise. Methods and systems disclosed herein may thus be utilized, without limitation, in environment where SNR is relatively low.

SNR gain in the FFT may be represented as:

$$\text{SNR Gain} = 10 * \log_{10}(i) \quad \text{(Eq. 3)}$$

Where i equals 90, such as in examples above, and where a frequency offset coincides with a frequency bin of the FFT:

$$\text{SNR Gain} = 10 * \log_{10}(90) = 19.5 \text{ dB}.$$

Where the frequency offset falls between frequency bins of the FFT, SNR Gain may be lower. For example, where the frequency offset falls midway between two frequency bins, SNR Gain may be approximately 17.5 dB. If the input SNR is −2 dB, for example, the SNR of a spectral peak may be approximately 15.5 dB, which is large enough to detect.

SNR Gain may be increased with a greater number of FFT points, which may be zero-padded, such as described further above.

Spectral contents of modulation-removed samples may be utilized to estimate frequency offset, such as described below with respect to FIG. 4.

Figure 4:
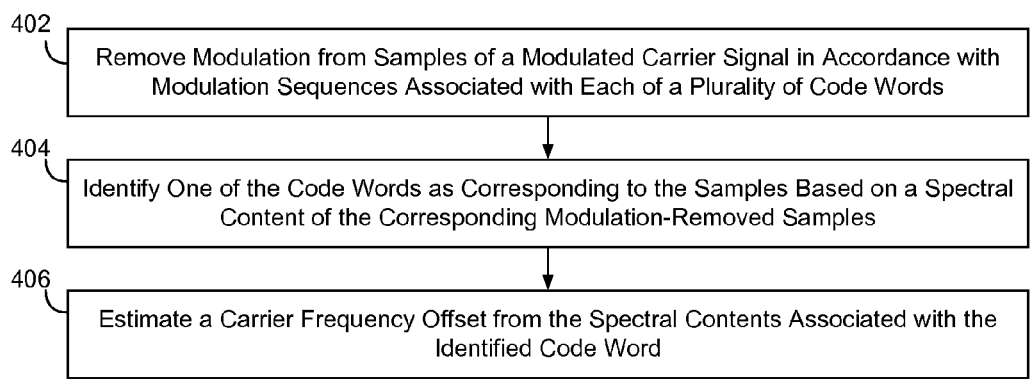
FIG. 4 is a process flowchart of a method of identifying a codeword such as illustrated in FIG. 2, and of estimating a frequency offset from the spectral content associated with the identified codeword.

FIG. 4 is a process flowchart of a method 400 of identifying a codeword associated with samples of a signal, such as described above with respect to method 200, and of estimating a frequency offset associated from the spectral content associated with the identified codeword.

At 402, modulation is removed from samples of a modulated carrier signal in accordance with modulation sequences associated with each of a plurality of codewords, such as described above with respect to 202 in FIG. 2.

At 404, one of the codewords is identified as corresponding to the samples based on spectral contents of the corresponding modulation-removed samples, such as described above with respect to 202 in FIG. 2.

At 406, a frequency offset is estimated from the spectral content associated with identified codeword.

Estimating of the frequency offset at 406, may include solving for offset frequency F in equation 2 above, with respect to the spectral contents associated with the codeword identified at 404.

Where the spectral contents are determined with a FFT, the frequency offset may be calculated with respect to a highest power frequency bin in accordance with:

$$\text{Frequency\_Offset} = \left(\frac{\text{Peak\_Location}}{\text{No\_of\_Bins}}\right) R_S \quad \text{(Eq. 4)}$$

In equation 4, No_of_Bins corresponds to a number of frequency bins associated with the FFT process, such as 128, and $R_S$ corresponds to a symbol rate.

The frequency offset may be determined from multiple frequency bins, such as a highest power frequency bin and its adjacent frequency bin, which may include interpolating the frequency offset between the multiple frequency bins.

Figure 5:
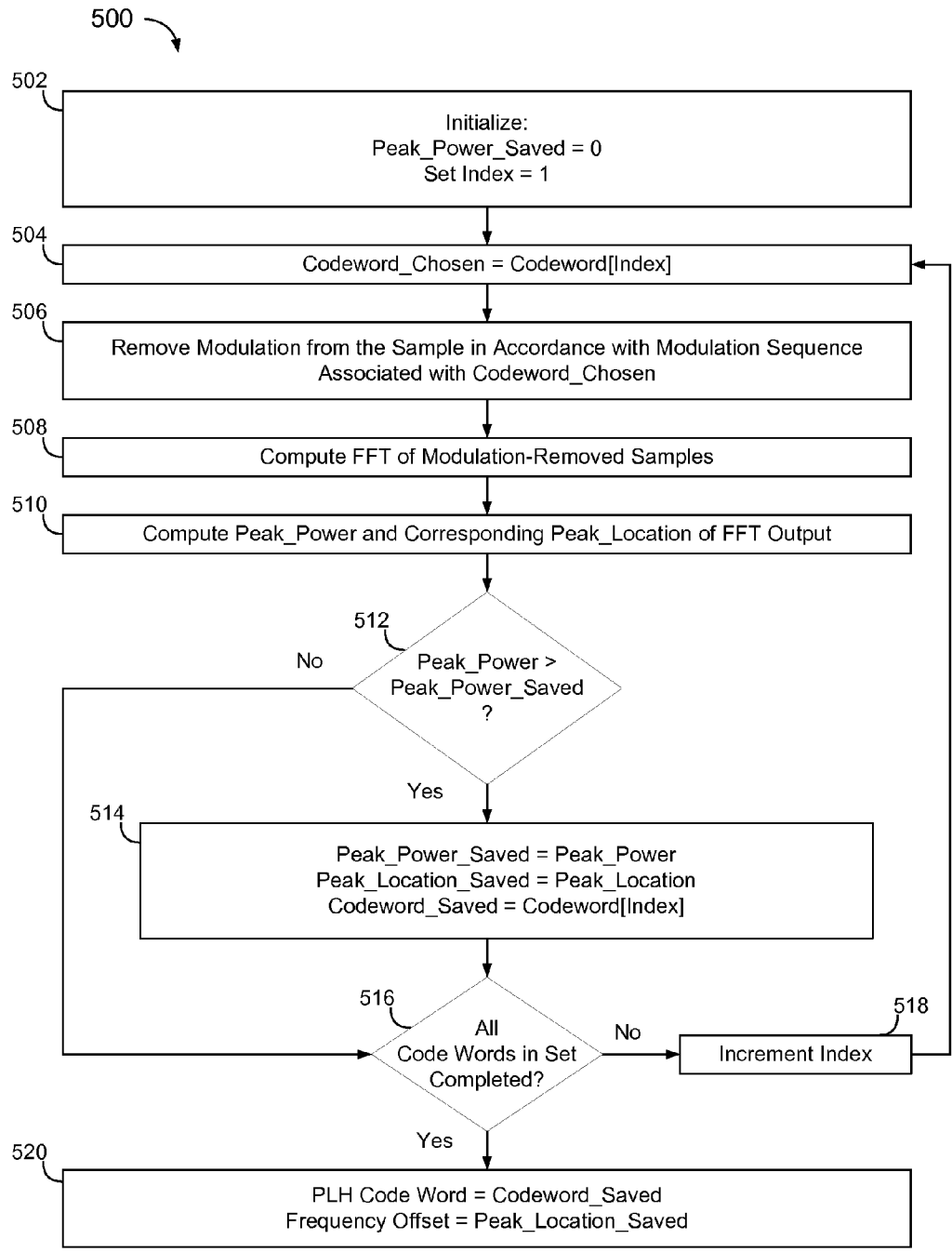
FIG. 5 is a process flowchart of an iterative method of analyzing spectral content for a plurality of codewords.

FIG. 5 is a process flowchart of an iterative method 500 of analyzing spectral content information for a plurality of codewords.

At 502, parameters are initialized. In the example of FIG. 5, a Peak_Power_Saved parameter is initialized to zero and an Index parameter is initialized to a value of one. Peak_Power_Saved is a variable threshold, against which peak power levels are compared. Index is an index to a set of modulation sequences associated with codewords.

At 504, a codeword index is selected. This may include setting a parameter Codeword_Chosen equal to Codeword [Index].

At 506, modulation is removed from a set of samples based on a modulation scheme associated with the selected codeword index, or Codeword_Chosen.

Removing of the modulation at 506 may include removing pseudo random binary sequences (PRBSs) from the samples.

At 508, an FFT is computed from the modulation-removed samples, such as described in one or more examples above.

At 510, a power figure is computed with respect to results of the FFT. The power figure may be computed with respect to a peak power location or frequency bin of the FFT. The power figure may be computed with respect to a highest peak power or a combination of peaks, such as described in one or more examples above.

The computing of the power figure at 510 may include setting a parameter Peak_Power equal to the computed power figure.

The computing at 510 may include determining or computing a frequency associated with the power figure, which may include setting a parameter Peak_Location equal to the computed frequency.

At 512, the power figure computed at 510 is compared to the threshold. The comparing may include comparing Peak_Power to Peak_Power_Saved.

When the power figure computed at 510 does not exceed the threshold, processing proceeds to 516, described further below.

When the power figure computed at 510 exceeds the threshold, processing proceeds to 514.

At 514, the threshold is set equal to the power figure computed at 510, and the codeword selected at 504 is identified as having the highest power figure. This may include setting Peak_Power_Saved to Peak_Power, and setting a parameter Codeword_Saved to Codeword[Index].

Where the computing at 510 includes computing the frequency associated with the power figure, the computed frequency may be stored with the identification of the codeword. This may include setting Peak_Location_Saved to Peak_Location.

At 516, processing may return to 504 to process another codeword. This may include incrementing Index at 518.

When there are no more codewords to process, processing proceeds to 520.

At 520, the codeword associated with the highest power figure computed at 512 is identified as the codeword associated with the samples. This may include setting a parameter PLH_Codeword to Codeword_Saved.

Where a frequency offset was computed at 510, the computed frequency offset is identified as a frequency offset of the samples. This may include setting a parameter Frequency_Offset to Peak_Location_Saved.

Where no peak power was identified from the modulation-removed samples, method 500, or portions thereof may be repeated with respect to complex conjugates of the modulation sequences to determine whether the samples were subjected to spectral inversion.

Figure 6:
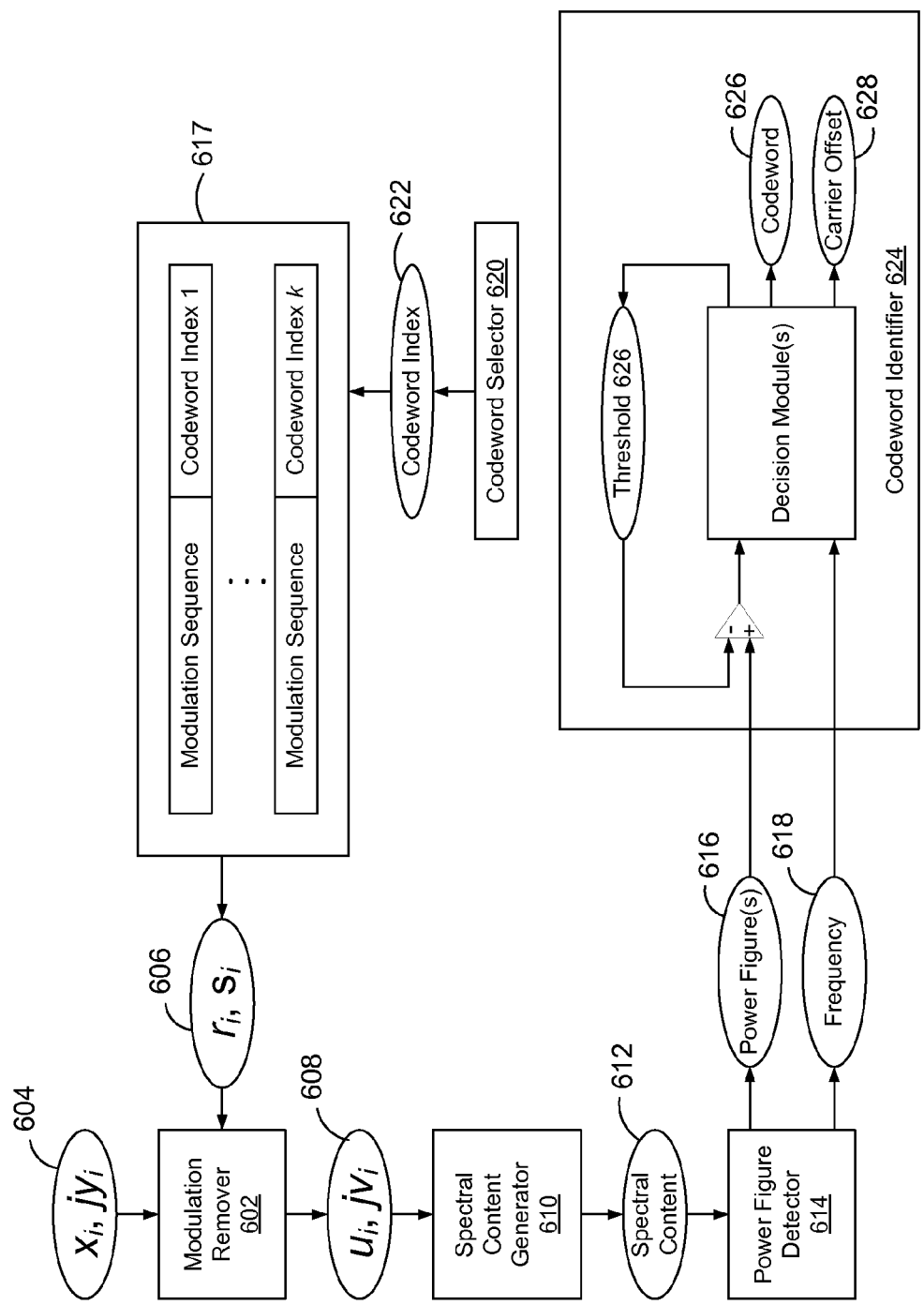
FIG. 6 is a block diagram of a system to decode samples and to estimate a frequency offset associated with the samples, based on spectral content of the samples.

FIG. 6 is a block diagram of a system 600 to decode samples and estimate a frequency offset associated with the samples, based on spectral contents of the samples.

System 600 includes a modulation remover 602 to remove modulation from samples 604 in accordance with a modulation sequence 606, and to output modulation-removed samples 608, such as described in one or more examples above.

System 600 further includes a spectral content generator 610 to generate spectral content 612 of modulation-removed samples 608, and a power figure detector 614 to determine one or more power FIG. 616, such as a peak power, from spectral content 612.

Power figure detector 614 may be configured to identify a frequency 618 associated with power FIG. 616, such as described in one or more examples above.

System 600 further includes a codeword selector 620 to select a codeword index 622 corresponding to a codeword within a set of codewords. System 600 is further configured to provide a modulation sequence associated with codeword index 622, as modulation sequence 606, to modulation remover 604. System 600 may include a table 617 of modulation sequences and associated codeword indexes. Codeword selector 620 may be configured to iteratively select codeword indexes, such as described in one or more examples above.

System 600 further includes a codeword identifier 624 to compare power FIG. 616 to a threshold 626, and to provide an identification 626 of a codeword that corresponds to samples 604, based on the comparison.

Codeword identifier 624 may be configured to estimate a frequency offset 628 from corresponding frequency information 618.

Figure 7:
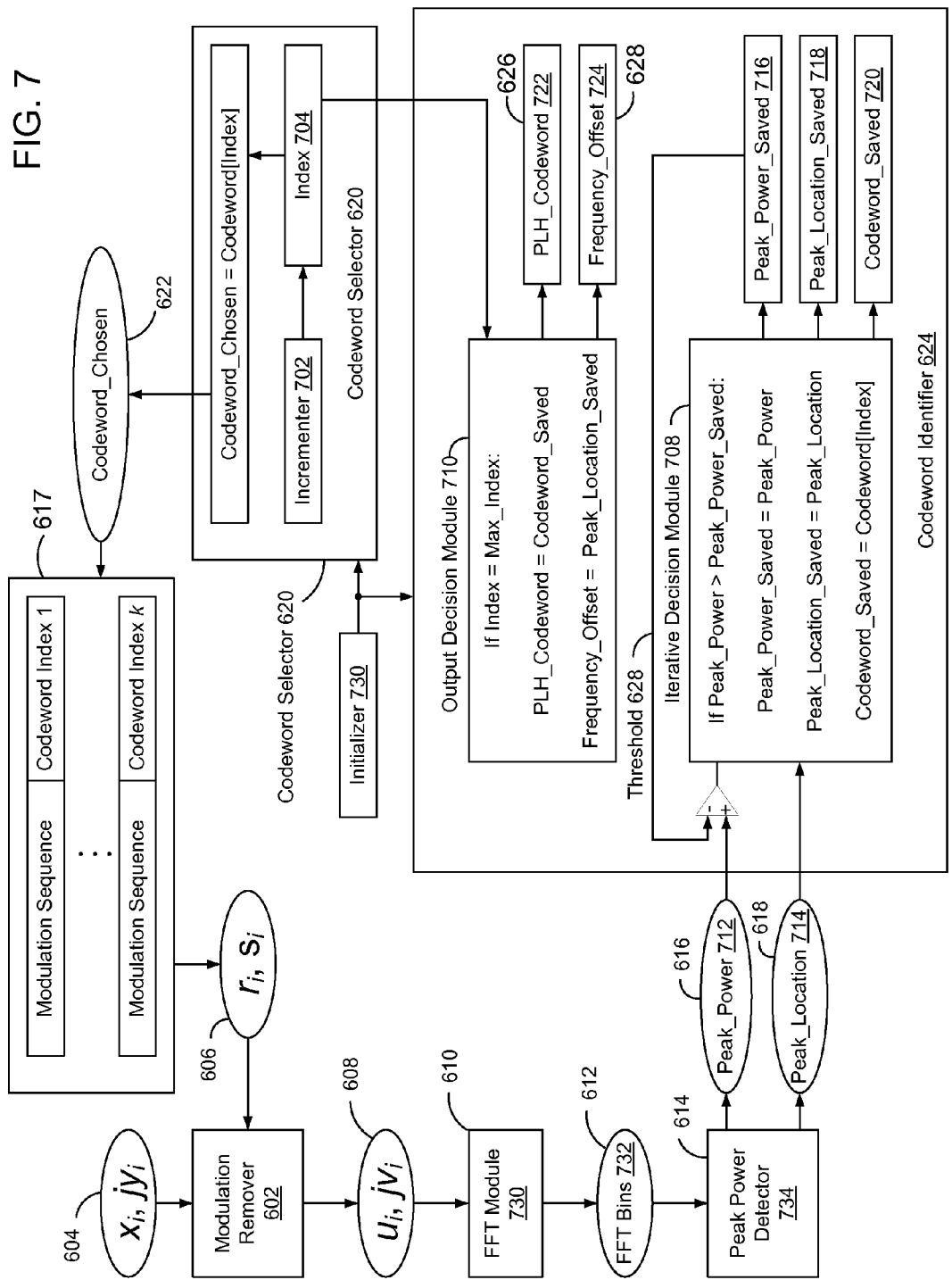
FIG. 7 is a block diagram of the system of FIG. 6, configured in accordance with the method of FIG. 5.

FIG. 7 is a block diagram of system 600, wherein codeword selector 620 and codeword identifier 624 are configured in accordance with method 500.

In FIG. 7, codeword selector 620 includes an incrementer 702 to increment an Index 704.

Codeword selector 620 may be configured to set a parameter Codeword_Chosen equal to Codeword[Index 704], and to provide Codeword_Chosen as codeword index 622, such as described above with respect to FIG. 5.

In FIG. 7, codeword identifier 624 includes an iterative decision module 708 and an output decision module 710.

Iterative decision module 708 is configured to evaluate a comparison between threshold 628 and power FIG. 616, illustrated here as Peak_Power_Saved 716 and Peak_Power 712, respectively, and to selectively update Peak_Power_Saved 716 and a parameter Codeword_Saved 720, such as described above with respect to 514 in FIG. 5.

Iterative decision module 708 may be further configured to update a parameter Peak_Location_Saved 720 in response to a corresponding frequency 618, illustrated in FIG. 7 as Peak_Location 714, such as described above with respect to 514 in FIG. 5.

Output decision module 710 is configured to provide Codeword_Saved 720 as codeword identification 626, illustrated here as PLH_Codeword 722, such as described above with respect to 520 in FIG. 5.

Output decision module 710 may be configured to provide Peak-Location_Saved 718 as frequency offset 628, illustrated here as Frequency_Offset 724, such as described above with respect to 520 in FIG. 5.

In FIG. 7, system 600 includes an initializer 730 to initialize parameters, such as Peak_Power_Saved 716 and Index 704, such as described above with respect to 502 in FIG. 5.

Spectral content generator 610 may include an FFT module 730 to output spectral content 612 as FFT bins 732.

Power figure detector 614 may include a peak power detector 734 to output Peak_Power 712, and corresponding Peak_Location 714.

System 600, as illustrated in one or more of FIGS. 6 and 7, or portions thereof, may be implemented within a receiver system, which may include a set-top box, such as to receive digital video broadcast signals.

Figure 8:
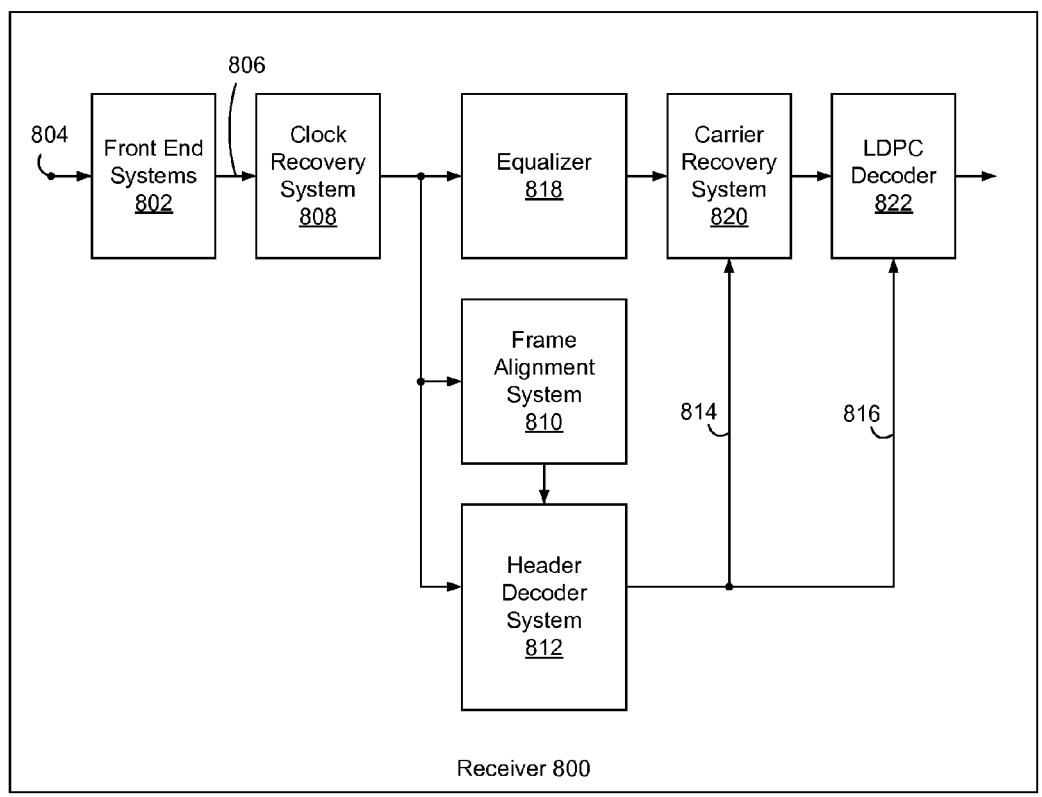
FIG. 8 is a block diagram of an example receiver system, including a header decoder system to decode a header based on spectral contents of the header.

FIG. 8 is a block diagram of an example receiver system 800, including one or more front end systems 802 to receive and sample a signal 804, such as a digital video broadcast signal, and a clock recovery system 808 to recover timing information from samples 806.

Receiver 800 may include a frame alignment system, 810 to identify portions of samples 806 that correspond to a data frame and an associated header based on timing information from clock recovery system 808.

Receiver 800 may include a header decoder system 812 to decode the header based on spectral data of the header portion of samples 806, such as described in one or more examples above. System 812 may be configured to output an identification 814 of a codeword that corresponds to the header.

Decoder system 812 may be further configured to estimate a frequency offset 816 associated with samples 806 from corresponding spectral data, such as described in one or more examples above.

Receiver 800 may include an equalizer 818 to equalize samples 806, substantially in parallel with operations of frame alignment system 812 and header decoder system 812.

Receiver 800 may include a carrier recovery system 820 to compensate samples 806 with respect to estimated frequency offset 816.

Receiver 800 may include a decoder 822, such as an LDPC decoder, to decode the frame in accordance with transmission parameters associated with codeword indication 814, such as described in one or more examples above.

One or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, or a combination of integrated circuit packages. The term software, as used herein, refers to a computer program product including a computer readable medium having computer program logic stored therein to cause a computer system to perform one or more features and/or combinations of features disclosed herein.

For example, and without limitation, system 600, as illustrated in one or more of FIGS. 6 and 7, or portions thereof, may be implemented within hardware-based digital logic circuitry, an instruction processor, including a micro-controller, and combinations thereof. Variables may be held in one or more of buffers, registers, and memory cells.

Figure 9:
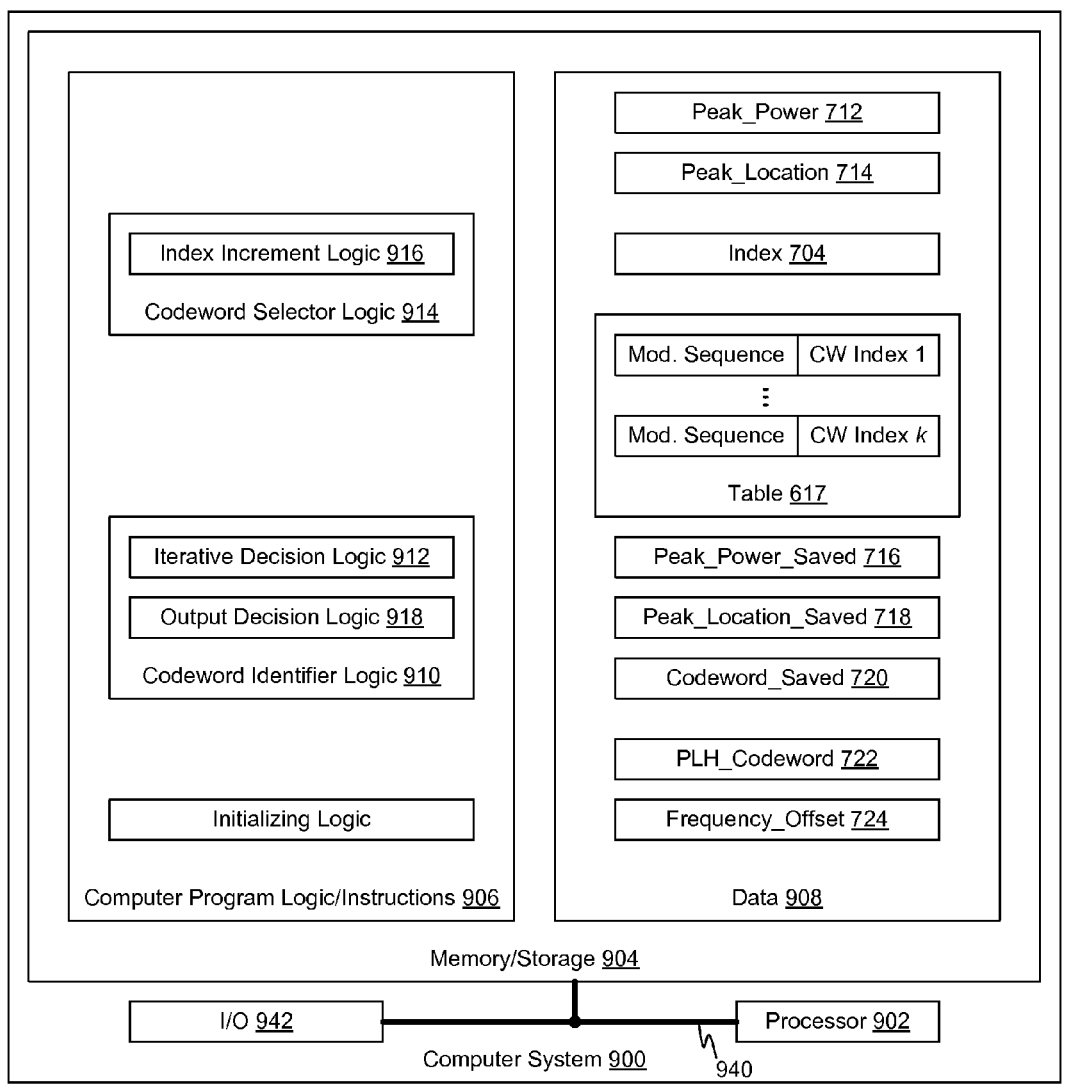
FIG. 9 is a block diagram of an instruction processor system, configured to identify a codeword associated with samples of a modulated carrier signal base on spectral contents of the samples.

FIG. 9 is a block diagram of an instruction processor system 900, configured to identify a codeword associated with samples of a modulated carrier signal based on spectral contents of the samples.

System 900 includes one or more computer instruction processing units, illustrated here as a processor 902, to execute computer program product logic, also known as instructions, code, and software.

System 900 further includes memory and/or storage 904, including a computer readable medium having computer program product logic or instructions 906 stored thereon, to cause processor 902 to perform one or more functions in response thereto.

Memory/storage 904 further includes data 908 to be used by processor 902 in executing instructions 906, and/or generated by processor 902 in response to execution of instructions 906.

In the example of FIG. 9, logic 906 includes codeword identifier logic 910 to cause processor 902 to identify a codeword associated with samples of a modulated carrier signal based on spectral contents of the samples, such as described in one or more examples above.

Codeword identifier logic 910 may include iterative decision logic 912 to cause processor 902 to compare Peak_Power 712 with Peak_Power Saved 716, and to selectively update Peak_Power Saved 716 and Codeword_Saved 720, such as described in one or more examples above.

System 900 may be configured to receive Peak_Power_Saved 712 from hardware-based logic, which may include one or more of power figure detector 614, spectral content generator 610, and modulation remover 602, as described above with respect to one or more of FIGS. 6 and 7.

Alternatively, logic 906 may include one or more of power figure detector logic, spectral content generator logic, and modulation remover logic to cause processor 902 to implement corresponding functionality.

Iterative decision logic 912 may include logic to cause processor 902 to update Peak_Location_Saved 716 with Peak_Location 714, in response to updates of Peak_Power Saved 716 and Codeword_Saved 720, such as described in one or more examples above.

Logic 906 may include codeword selector logic 914 to cause processor 902 to iteratively select one of a plurality of modulation sequences, each associated with a corresponding codeword or codeword index, and to provide the selected modulation sequence to modulation remover 602 in one or more of FIGS. 6 and 7.

Codeword selector logic 914 may include index increment logic 916 to cause processor 902 to increment Index 704, and to iteratively process a set of samples with respect to a plurality of modulation sequences. System 900 may include modulation sequences in table 617.

Codeword identifier logic 910 may include output decision logic 918 to cause processor 902 to output Codeword_Saved 720 as PLH_Codeword 722, upon a determination that all codewords, or corresponding modulation sequences have been processed.

Output decision logic 918 may include logic to cause processor 902 to output Peak_Location_Saved 718 as Frequency_Offset 724 upon the determination that all codewords, or corresponding modulation sequences have been processed.

Logic 906 may include inversion detection logic 726 to cause processor 902 to detect spectral inversion, such as described in one or more examples above.

System 900 may include a communications infrastructure 940 to provide communication within system 900.

System 900 may include an input/output controller 942 to provide communication with external systems.

Computer system 900 may be configured to host one or more operating environments within which to execute logic 906.

Computer system 900 may include a microcontroller.

One or more of logic 906 and table 617, or portions thereof, may be stored within non-volatile memory, such as firmware, and may be copied to processor memory at run-time.

Variables within data 908, or portions thereof, may be held in one or more of buffers, registers, memory, and combinations thereof.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

One skilled in the art will recognize that these functional building blocks can be implemented by discrete components, application specific integrated circuits, processors executing appropriate software, and combinations thereof.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the exemplary embodiments disclosed herein.

What is claimed is:

1. A method, comprising:
removing modulation from samples of a modulated carrier signal based on each of multiple modulation sequences to provide modulation-removed samples for each of the modulation sequences, wherein each modulation sequence includes a corresponding set of binary coordinates, and wherein each modulation sequence is associated with a corresponding codeword;
determining spectral contents of the modulation-removed samples, for each of the modulation sequences; and
identifying a first one of the codewords, corresponding to a first one of the modulation techniques, as corresponding to the samples of the modulated carrier signal based on the spectral contents of the corresponding modulation-removed samples.

2. The method of claim 1, wherein:
the determining includes determining a spectral peak for each of the modulation sequences from the corresponding modulation removed samples; and
the identifying includes identifying the first codeword as corresponding to the samples of the modulated carrier signal when the spectral peak determined for the first modulation sequence is greater than spectral peaks determined for remaining ones of the modulation sequences.

3. The method of claim 1, wherein:
the determining includes determining a ratio of a largest spectral peak and second largest spectral peak not adjacent to the largest spectral peak, for each of the modulation sequences; and
the identifying includes identifying the first codeword as corresponding to the samples of the modulated carrier signal when the ratio determined for the first modulation sequence is greater than the ratios determined for remaining ones of the modulation sequences.

4. The method of claim 1, further including:
estimating a frequency offset of the samples from based on the spectral content determined for first modulation sequence.

5. The method of claim 4, wherein the estimating:
estimating the frequency offset from a frequency associated with a largest spectral peak.

6. The method of claim 4, wherein the estimating a frequency offset includes:
interpolating between a frequency bin of a largest spectral peak and an adjacent frequency bin of the spectral content determined for the first modulation sequence.

7. The method of claim 1, further including:
removing modulation from the samples of the modulated carrier signal based on complex conjugates of each of the multiple modulation sequences to provide complex-conjugate modulation-removed samples for each of the modulation sequences;
determining spectral contents of the complex-conjugate modulation-removed samples for each of the modulation sequences; and
identifying the first one of the codewords as corresponding to the samples of the modulated carrier signal based on the spectral contents of the corresponding complex-conjugate modulation-removed samples.

8. The method of claim 1, further including generating the modulated carrier signal, including:
encoding each of multiple data frames, and modulating a carrier signal with the encoded data frames, based on corresponding data frame transmission parameters;
encoding the data frame transmission parameters as one of the multiple codewords in a physical layer header (PHY) of the corresponding data frames; and
for each PHY, modulating the carrier signal with on one of the multiple modulation sequences based on the codeword of the PHY;
wherein the samples of the modulated carrier signal correspond to one of the PHYs.

9. A system, comprising:
a modulation removal module to remove modulation from samples of a modulated carrier signal based on each of multiple modulation sequences to provide modulation-removed samples for each of the modulation sequences, wherein each modulation sequence includes a corresponding set of binary coordinates, and wherein each modulation sequence is associated with a corresponding codeword;
a spectral content estimation module to determine spectral contents of the modulation-removed samples, for each of the modulation sequences; and
a codeword identifier to identify a first one of the codewords, corresponding to a first one of the modulation sequences, as corresponding to the samples of the modulated carrier signal based on the spectral contents of the corresponding modulation-removed samples.

10. The system of claim 9, wherein:
the spectral content estimation module is configured to determine a spectral peak for each of the modulation sequences from the corresponding modulation removed samples; and
the codeword identifier is configured to identify the first codeword as corresponding to the samples of the modulated carrier signal when the spectral peak determined for the first modulation sequence is greater than spectral peaks determined for remaining ones of the modulation sequences.

11. The system of claim 9, wherein:
the spectral content estimation module is configured to determine a ratio of a largest spectral peak and a second largest spectral peak not adjacent to the largest spectral peak, for each of the modulation sequences; and
the codeword identifier is configured to identify the first codeword as corresponding to the samples of the modulated carrier signal when the ratio determined for the first modulation sequence is greater than the ratios determined for remaining ones of the modulation sequences.

12. The system of claim 9, wherein the codeword identifier is configured to estimate a frequency offset of the samples based on the spectral content determined for the first modulation sequence.

13. The system of claim 12, wherein the codeword identifier is further configured to estimate the frequency offset from a frequency associated with a largest spectral peak.

14. The system of claim 12, wherein the codeword identifier is configured to estimate the frequency offset based on an interpolation between a frequency bin of a largest spectral peak and an adjacent frequency bin.

15. The system of claim 9, wherein:
the modulation removal module is configured to remove the modulation from the samples of the modulated carrier signal based on complex conjugates of each of the multiple modulation sequences to provide complex-conjugate modulation-removed samples for each of the modulation sequences;
the spectral content estimation module is configured to determine spectral contents of the complex-conjugate modulation-removed samples for each of the modulation sequences; and
the codeword identifier module is configured to identify the first one of the codewords as corresponding to the samples of the modulated carrier signal based on the spectral contents of the corresponding complex-conjugate modulation-removed samples.

16. The system of claim 9, further including a transmitter to generate the modulated carrier signal, including to:
encode each of multiple data frames, and modulate a carrier signal with the encoded data frames, based on corresponding data frame transmission parameters;
encode the data frame transmission parameters as one of the multiple codewords in a physical layer header (PHY) of the corresponding data frames; and
for each PHY, modulate the carrier signal with on one of the multiple modulation sequences based on the codeword of the PHY;
wherein the samples of the modulated carrier signal correspond to one of the PHYs.

17. A non-transitory computer readable medium encoded with a computer program to cause a processor to:
remove modulation from samples of a modulated carrier signal based on each of multiple modulation sequences to provide modulation-removed samples for each of the modulation sequences, wherein each modulation sequence includes a corresponding set of binary coordinates, and wherein each modulation sequence is associated with a corresponding codeword;
determine spectral contents of the modulation-removed samples, for each of the modulation sequences; and
identify a first one of the codewords, corresponding to a first one of the modulation sequences, as corresponding to the samples of the modulated carrier signal based on the spectral contents of the corresponding modulation-removed samples.

18. The computer readable medium of claim 17, further including instructions to cause the processor to:
estimate a frequency offset of the samples based on the spectral content determined for the first modulation sequence.

19. The computer readable medium of claim 17, further including instructions to cause the processor to:
determine a spectral peak for each of the modulation sequences from the corresponding modulation removed samples; and
identify the first codeword as corresponding to the samples of the modulated carrier signal when the spectral peak determined for the first modulation sequence is greater than spectral peaks determined for remaining ones of the modulation sequences.

20. The computer readable medium of claim 17, further including instructions to cause the processor to:
remove modulation from the samples of the modulated carrier signal based on complex conjugates of each of the multiple modulation sequences to provide complex-conjugate modulation-removed samples for each of the modulation sequences;
determine spectral contents of the complex-conjugate modulation-removed samples for each of the modulation sequences; and
identify the first one of the codewords as corresponding to the samples of the modulated carrier signal based on the spectral contents of the corresponding complex-conjugate modulation-removed samples.

\* \* \* \* \*

UNITED STATES PATENT AND TRADEMARK OFFICE
CERTIFICATE OF CORRECTION

PATENT NO.        : 8,392,802 B2
APPLICATION NO.   : 12/646680
DATED             : March 5, 2013
INVENTOR(S)       : Bernard Arambepola et al.

Page 1 of 1

It is certified that error appears in the above-identified patent and that said Letters Patent is hereby corrected as shown below:

On the title page, item (73), in column 1, in "Assignee", line 1, delete "Sant" and insert -- Santa --, therefor.

In the Claims

In column 9, line 65, in claim 5, delete "estimating:" and insert -- includes: --, therefor.

Signed and Sealed this
Third Day of September, 2013

Teresa Stanek Rea
*Acting Director of the United States Patent and Trademark Office*